United States Patent
Noda et al.

(10) Patent No.: US 9,547,239 B2
(45) Date of Patent: Jan. 17, 2017

(54) POSITIVE PHOTOSENSITIVE RESIN COMPOSITION, METHOD FOR FORMING POLYIMIDE RESIN PATTERNS, AND PATTERNED POLYIMIDE RESIN FILM

(71) Applicant: Tokyo Ohka Kogyo Co., Ltd., Kawasaki-Shi (JP)

(72) Inventors: Kunihiro Noda, Kawasaki (JP); Hiroki Chisaka, Kawasaki (JP); Dai Shiota, Kawasaki (JP)

(73) Assignee: TOKYO OHKA KOGYO CO., LTD., Kawasaki-shi (JP)

( * ) Notice: Subject to any disclaimer, the term of this patent is extended or adjusted under 35 U.S.C. 154(b) by 0 days.

(21) Appl. No.: 14/438,182

(22) PCT Filed: Oct. 25, 2013

(86) PCT No.: PCT/JP2013/078946
§ 371 (c)(1),
(2) Date: Apr. 23, 2015

(87) PCT Pub. No.: WO2014/065398
PCT Pub. Date: May 1, 2014

(65) Prior Publication Data
US 2015/0261086 A1    Sep. 17, 2015

(30) Foreign Application Priority Data

Oct. 26, 2012  (JP) ................. 2012-237012

(51) Int. Cl.
| G03F 7/039 | (2006.01) |
| G03F 7/004 | (2006.01) |
| G03F 7/20  | (2006.01) |
| G03F 7/26  | (2006.01) |

(52) U.S. Cl.
CPC ............ *G03F 7/039* (2013.01); *G03F 7/0045* (2013.01); *G03F 7/20* (2013.01); *G03F 7/26* (2013.01)

(58) Field of Classification Search
CPC ..................................... G03F 7/039
See application file for complete search history.

(56) References Cited

U.S. PATENT DOCUMENTS

| 5,545,509 A * | 8/1996 | Cameron | G03F 7/038 430/270.1 |
| 6,183,934 B1 | 2/2001 | Kawamonzen | |
| 7,851,121 B2 * | 12/2010 | Yamanaka | G03F 7/0046 430/191 |
| 2011/0086311 A1 * | 4/2011 | Katayama | C08G 73/10 430/280.1 |
| 2011/0233048 A1 * | 9/2011 | Kuramoto | C07C 271/12 204/157.82 |
| 2013/0126860 A1 * | 5/2013 | Fukuda | C08L 79/08 257/43 |
| 2014/0231729 A1 * | 8/2014 | Shiota | C09B 23/143 252/586 |
| 2014/0234784 A1 * | 8/2014 | Chisaka | G03F 7/325 430/325 |

FOREIGN PATENT DOCUMENTS

| JP | H11-072918 | 2/2001 |
| JP | 2001-066781 | 3/2001 |
| JP | 2003-076013 | 3/2003 |
| JP | 2007-086763 | 4/2007 |
| JP | 2011-080032 A | 4/2011 |

OTHER PUBLICATIONS

Search Report, in International Application No. PCT/JP2013/078946, mailed Nov. 26, 2013.
Extended European search report in European Patent Application No. 13848508.1, dated Apr. 19, 2016.

* cited by examiner

*Primary Examiner* — Cynthia Hamilton
(74) *Attorney, Agent, or Firm* — Knobbe Martens Olson & Bear LLP

(57) ABSTRACT

A positive photosensitive resin composition containing a polyimide resin that allows patterns to be satisfactorily formed by photolithography, and provides patterns with excellent heat resistance, and a method for forming polyimide resin patterns using the positive photosensitive resin composition. A patterned polyimide resin film formed by the method for forming polyimide resin patterns. To the photosensitive resin composition are added a polyimide resin, and a compound in which an imidazole compound having a specific structure is generated by the action of light.

5 Claims, No Drawings

POSITIVE PHOTOSENSITIVE RESIN COMPOSITION, METHOD FOR FORMING POLYIMIDE RESIN PATTERNS, AND PATTERNED POLYIMIDE RESIN FILM

This application is the U.S. National Phase under 35 U.S.C. §371 of International Application PCT/JP2013/078946, filed Oct. 25, 2013, designating the U.S., and published in Japanese as WO 2014/065398 on May 1, 2014, which claims priority to Japanese Patent Application No. 2012-237012, filed Oct. 26, 2012.

TECHNICAL FIELD

The present invention relates to a positive photosensitive resin composition containing a polyimide resin, a method for forming a polyimide resin pattern using the positive photosensitive resin composition, and a polyimide resin film formed by the method for forming a polyimide resin pattern.

BACKGROUND ART

The polyimide resin has characteristics such as superior heat resistance, mechanical strength and insulative properties or a low dielectric constant. Therefore, the polyimide resin is used widely as an insulating material or a protective material in electric or electronic parts including various elements or electronic substrates such as a multilayered wiring board. Also, in order to insulate or protect a minute point selectively in precision electric or electronic parts, an insulating film or an overcoating film is preferably formed by photolithography using a photosensitive resin composition from a standpoint of ease of processing.

Conventionally, in photosensitive resin compositions which are applicable to photolithography, a resin having in a side chain a functional group which can react with a base (e.g., a carboxyl group and a phenolic hydroxyl group) or a resin having a reactive group which reacts with an acid or a base to produce a carboxyl group or a phenolic hydroxyl group (a carboxyl group or a phenolic hydroxyl group protected by a protecting group which can be deprotected by acid or a base) can be employed (patent document 1).

However, a polyimide resin usually does not have a reactive group to produce a carboxyl group or a phenolic hydroxyl group by reacting with an acid or a base. Depending on the composition of monomers, a polyimide resin may have such a carboxyl group in a side chain, but the content of the carboxyl group of such a polyimide resin is insufficient to be used as a resin for a photosensitive resin composition.

It is also possible to introduce into a polyimide resin such a reactive group which generates a carboxyl group or a phenolic hydroxyl group by reacting with an acid or a base. However, in this case, there is a problem that the remarkably high cost is required for the synthesis of such a polyimide resin. Thus, it is difficult to blend a general polyimide resin in a photosensitive resin composition for photolithography. Therefore, it is desired to provide a resin composition containing a polyimide resin with photosensitivity by which pattern formation is possible.

A photosensitive resin composition containing a polyimide resin (polyetherimide) and a photo acid generator is proposed to solve such a problem (patent document 2). Upon exposure, the photosensitive resin composition described in patent document 2 is solubilized in a developing solution containing hydroxylamine, N-methyl-2-pyrrolidone and ion exchanged water.

Patent Document 1: Japanese Unexamined Patent Application, Publication No. 2001-066781
Patent Document 2: Japanese Unexamined Patent Application, Publication No. 2003-076013

DISCLOSURE OF THE INVENTION

Problems to be Solved by the Invention

However, in the investigations made by the present inventors, heat-resistance of the pattern formed using the photosensitive resin composition disclosed in patent document 2 containing a polyimide resin and a photo acid generator was found to be poor.

The present invention has been made in view of the problem described above and it is an object of the present invention to provide a positive photosensitive resin composition containing a polyimide resin which enables a pattern to be satisfactorily formed by photolithography and provide a pattern with excellent heat resistance. It is also an object of the present invention to provide a method for forming a polyimide resin pattern using the positive photosensitive resin composition. Furthermore, it is also an object of the present invention to provide a patterned polyimide resin film formed by the method for forming a polyimide resin pattern.

Means for Solving the Problems

The present inventors have found that the problems described above can be solved by adding, to a photosensitive resin composition, an (A) polyimide resin and a (B) compound that generates an imidazole compound having a specific structure by the action of light, thereby completing the present invention.

The first aspect of the present invention is a positive photosensitive resin composition containing an (A) polyimide resin and a (B) compound that generates an imidazole compound, by the action of light, represented by the following formula:

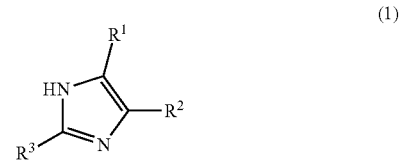

wherein, in the formula (1), $R^1$, $R^2$ and $R^3$ each independently represent a hydrogen atom, a halogen atom, a hydroxyl group, a mercapto group, a sulfide group, a silyl group, a silanol group, a nitro group, a nitroso group, a phosphino group, a sulfonato group, a phosphino group, a phosphinyl group, a phosphonato group, or an organic group.

A second aspect of the present invention is
a method for forming a polyimide resin pattern, the method comprising:
a coating film-forming step of forming a coating film of the positive photosensitive resin composition according to the first aspect;
an exposure step of exposing the coating film to a predetermined pattern; and
a development step of removing exposed portions of the exposed coating film for development.

The third aspect of the present invention is a patterned polyimide resin film formed by the method according to the second aspect.

Effects of the Invention

According to the present invention, it is possible to provide a positive photosensitive resin composition containing a polyimide resin which enables a pattern to be satisfactorily formed by photolithography and provides a pattern with excellent heat resistance. Further, according to the present invention, it is also possible to provide a method for forming a polyimide resin pattern using the positive photosensitive resin composition. Furthermore, according to the present invention, it is also possible to provide a patterned polyimide resin film formed by the method for forming a polyimide resin pattern.

PREFERRED MODE FOR CARRYING OUT THE INVENTION

Positive Photosensitive Resin Composition

The positive photosensitive resin composition according to the first aspect contains an (A) polyimide resin and a (B) compound that generates an imidazole compound represented by the above formula (1) by the action of light. The positive photosensitive resin composition may contain a (C) organic solvent. Below, the components of the positive photosensitive resin composition according to the first aspect will be explained.

(A) Polyimide Resin

The positive photosensitive resin composition according to the first aspect contains an (A) polyimide resin (hereinafter also referred to as "component (A)"). The type of polyimide resin is not particularly limited and may be appropriately selected from polyimide resins conventionally used in applications including insulating films or protective films, etc. and used.

Examples of preferred polyimide resins include polyimide resins composed of the constituting unit represented by the following formula (A-1).

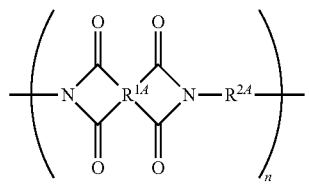

(A-1)

In the formula (A-1), $R^{1A}$ is a tetravalent organic group; $R^{2A}$ is a divalent organic group; and n is the number of repeating units of the constituting unit represented by the formula (A-1).

In the formula (A-1), number of carbon atoms of $R^{1A}$ and $R^{2A}$ are preferably 2 to 50, and more preferably 2 to 30. Each of $R^{1A}$ and $R^{2A}$ can be either an aliphatic group, an aromatic group, or a group with a combination of these structures. $R^{1A}$ and $R^{2A}$ can include, in addition to a carbon atom and a hydrogen atom, a halogen atom, an oxygen atom, and a sulfur atom. In a case in which $R^{1A}$ and $R^{2A}$ include an oxygen atom, a nitrogen atom or a sulfur atom, the oxygen atom, the nitrogen atom or the sulfur atom can be included in $R^{1A}$ and $R^{2A}$ as a group selected from: a nitrogen-containing heterocyclic group; —CONH—; —NH—; —N═N—; —CH═N—; —COO—; —O—; —CO—; —SO—; —SO$_2$—; —S—; and —S—S—, and more preferably included in $R^{1A}$ and $R^{2A}$ as a group selected from: —O—; —CO—; —SO—; —SO$_2$—; —S—; and —S—S—.

The preparation method of the polyimide resins composed of the constituting unit represented by the above formula (A-1) is not particularly limited. For instance, the polyimide resin composed of the constituting unit represented by the above formula (A-1) is obtained by ring closure of a polyamic acid composed of the constituting unit represented by the following formula (A-2), by means of heating or a base catalyst,

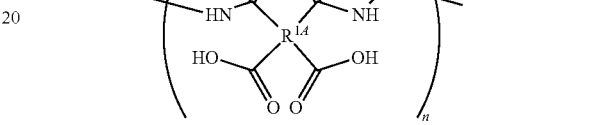

(A-2)

In the formula (A-2), $R^{1A}$ and $R^{2A}$ are as defined for formula (A-1) and n is the number of repeating units of the constituting unit represented by the formula (A-2).

The polyamic acid composed of the constituting unit represented by the above formula (A-2) is obtained by the reaction of a tetracarboxylic dianhydride and a diamine in a solvent. Tetracarboxylic dianhydride and diamine as raw materials for synthesizing polyamic acid are not particularly limited as long as the polyamic acid can be formed by the reaction between the dianhydride group and the amino group.

The amounts to be used of tetracarboxylic dianhydride and diamine in synthesizing a polyamic acid are not particularly limited. Diamine is preferably used in an amount of from 0.50 to 1.50 moles, more preferably from 0.60 to 1.30 moles, and particularly preferably from 0.70 to 1.20 moles based on 1 mole of tetracarboxylic dianhydride.

The tetracarboxylic dianhydride can be appropriately selected from tetracarboxylic dianhydrides which are conventionally used as a synthesis material for the polyamic acid. The tetracarboxylic dianhydride can be either an aromatic tetracarboxylic dianhydride or an aliphatic tetracarboxylic dianhydride; however, an aromatic tetracarboxylic dianhydride is preferable from the viewpoint of thermal resistance of the polyimide resin formed. The tetracarboxylic dianhydride component can be used either singly or in combination of two or more.

Specific examples of preferred aromatic tetracarboxylic dianhydride include: pyromellitic dianhydride; 3,3',4,4'-biphenyl tetra carboxylic dianhydride; 2,3,3',4'-biphenyl tetra carboxylic dianhydride; 3,3',4,4'-benzophenone tetra carboxylic dianhydride; 4,4'-oxydiphthalic anhydride; 3,3',4,4'-diphenyl sulfone tetra carboxylic dianhydride; and the like. Among these, 3,3',4,4'-biphenyl tetra carboxylic dianhydride and pyromellitic dianhydride are preferable from the viewpoint of price, availability, and the like. Since a fine pattern is likely to be formed by using the positive photosensitive resin composition, 3,3',4,4'-biphenyl tetra carboxylic dianhydride is more preferable.

[Diamine Component]

Diamines may be appropriately selected from conventional diamines used as a raw material for synthesizing the polyamic acid. Diamines may be an aromatic diamine or an aliphatic diamine. Aromatic diamines are preferred from the viewpoint of heat resistance of the resulting polyimide resin. Diamines may be used in a combination of two or more.

Specific examples of preferred aromatic diamine include: p-phenylenediamine; m-phenylenediamine; 2,4-diamino toluene; 4,4'-diamino biphenyl; 4,4'-diamino-2,2'-bis(trifluoromethyl) biphenyl; 3,3'-diaminodiphenyl sulfone; 4,4'-diaminodiphenyl sulfone; 4,4'-diaminodiphenyl sulfide; 4,4'-diaminodiphenylmethane; 4,4'-diamino diphenyl ether; 3,4'-diamino diphenyl ether; 3,3'-diamino diphenyl ether; 1,4-bis(4-aminophenoxy)benzene; 1,3-bis(4-aminophenoxy)benzene; 1,3-bis(3-aminophenoxy)benzene; 4,4'-bis(4-aminophenoxy) biphenyl; bis[4-(4-aminophenoxyl)phenyl]sulfone; bis[4-(3-aminophenoxyl)phenyl]sulfone; 2,2-bis[4-(4-aminophenoxyl)phenyl]propane; and 2,2-bis[4-(4-aminophenoxyl)phenyl]hexafluoropropane; and the like. Among these, p-phenylenediamine, m-phenylenediamine, 2,4-diamino toluene, and 4,4'-diamino diphenyl ether are preferable from the viewpoint of price, availability, and the like.

The reaction between tetracarboxylic dianhydride and diamine is generally performed in an organic solvent. The organic solvent used for the reaction of tetracarboxylic dianhydride and diamine is not particularly limited, as long as the solvent can dissolve the tetracarboxylic dianhydride and the diamine and does not react with the tetracarboxylic acid dianhydride or the diamine.

Examples of the organic solvent used for the reaction of tetracarboxylic dianhydride and diamine include nitrogen-containing polar solvents such as N-methyl-2-pyrrolidone, N,N-dimethylacetamide, N,N-diethyl acetamide, N,N-dimethylformamide, N,N-diethylformamide, N-methylcaprolactam and N,N,N,N-tetramethyl urea; lactone-based polar solvents such as β-propiolactone, γ-butyrolactone, γ-valerolactone, δ-valerolactone, γ-caprolactone and ε-caprolactone; dimethyl sulfoxide; acetonitrile; fatty acid esters such as ethyl lactate and butyl lactate; and ethers such as diethyleneglycol dimethyl ether, diethyleneglycol diethyl ether, dioxane, tetrahydrofuran, methyl cellosolve acetate and ethyl cellosolve acetate.

Among these organic solvents, preferred are nitrogen-containing polar solvents including N-methyl-2-pyrrolidone, N,N-dimethylacetamide, N,N-diethyl acetamide, N,N-dimethylformamide, N,N-diethylformamide, N-methylcaprolactam and N,N,N,N-tetramethylurea for solubilities of the resulting polyamic acid or polyimide resins. These solvents may be used alone or in combination of two or more.

(B) Compound that Generates an Imidazole Compound by the Action of Light

The positive photosensitive resin composition according to the first aspect contains a (B) compound that generates an imidazole compound represented by the following formula by the action of light (hereinafter, also referred to as component (B)).

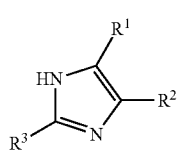

(1)

In the formula (1), $R^1$, $R^2$ and $R^3$ each independently represent a hydrogen atom, a halogen atom, a hydroxyl group, a mercapto group, a sulfide group, a silyl group, a silanol group, a nitro group, a nitroso group, a phosphino group, a sulfonato group, a phosphino group, a phosphinyl group, a phosphonato group, or an organic group.

The positive photosensitive resin composition according to the first aspect contains component (B) and, thereby, when the composition is selectively exposed to light, an imidazole compound is generated by the action of light in the exposed portions. The imidazole compound generated by exposure attacks a carbonyl group contained in the imide group that the polyimide resin, namely, component (A), includes, whereby a small amount of water contained in the positive photosensitive resin composition or moisture in the air causes hydrolysis of the imide group. When an imide group is hydrolyzed, a carboxyl group is generated, whereby the exposed portions of the positive photosensitive resin composition according to the first aspect become alkali soluble.

Further, when exposed to high temperatures, component (B) decomposes to the imidazole compound represented by the above formula (1) and a compound which can be condensed with the —NH— group included in the imidazole compound. Further, when the polyimide resin is exposed to high temperatures, imide bonds may be cleaved by hydrolysis, etc. However, in the pattern formed by using the positive photosensitive resin composition according to the first aspect, even when an imide bond in the polyimide resin cleaves, the imidazole compound represented by the above formula (1) and the compound which can be condensed with the —NH— group included in the imidazole compound, both compounds of which originate from component (B), promptly bond to the carboxyl group and the amino group which are generated by the cleavage, whereby thermolysis of the polyimide resin is suppressed.

As the organic group in $R^1$, $R^2$, and $R^3$, an alkyl group, an alkenyl group, a cycloalkyl group, a cycloalkenyl group, an aryl group, an aralkyl group, and the like can be exemplified. The organic group can include a bond other than a hydrocarbon group such as a hetero atom, or a substituent. In addition, the organic group can be either a straight chain, a branched chain, or cyclic. The organic group is generally monovalent; however, can also be an organic group of divalent or more in a case of forming a cyclic structure or the like.

$R^1$ and $R^2$ can bind to form a cyclic structure, and can further include a hetero atom bond. As the cyclic structure, a heterocycloalkyl group, a heteroaryl group and the like can be exemplified, and the cyclic structure can also be a condensed ring.

A bond included in the organic group of $R^1$, $R^2$, and $R^3$ is not particularly limited as long as the effect of the present invention is not impaired. The organic group can include a bond including a hetero atom such as an oxygen atom, a nitrogen atom, a silicon atom and the like. Specific examples of the bond including a hetero atom include an ether bond, a thioether bond, a carbonyl bond, a thiocarbonyl bond, an ester bond, an amide bond, a urethane bond, an imino bond (—N=C(—R)—, —C(=NR)—: R representing a hydrogen atom or an organic group), a carbonate bond, a sulfonyl bond, a sulfinyl bond, an azo bond and the like.

As the bond including a hetero atom which can be included in the organic group of $R^1$, $R^2$, and $R^3$, an ether bond, a thioether bond, a carbonyl bond, a thiocarbonyl bond, an ester bond, an amide bond, a urethane bond, an imino bond (—N=C(—R)—, —C(=NR)—: R representing a hydrogen atom or a monovalent organic group), a carbonate bond, a sulfonyl bond, and a sulfinyl bond are preferable from the viewpoint of thermal resistance of the imidazole compound.

In a case in which the organic group of $R^1$, $R^2$, and $R^3$ is a substituent other than a hydrocarbon group, $R^1$, $R^2$, and $R^3$ are not particularly limited as long as the effect of the present invention is not impaired. Specific examples of R', $R^2$, and $R^3$ include a halogen atom, a hydroxyl group, a mercapto group, a sulfide group, a cyano group, an isocyano group, a cyanato group, an isocyanato group, a thiocyanato group, an isothiocyanato group, a silyl group, a silanol group, an alkoxy group, an alkoxycarbonyl group, a carbamoyl group, a thiocarbamoyl group, a nitro group, a nitroso group, a carboxylate group, an acyl group, an acyloxy group, a sulfino group, a sulfonato group, a phosphino group, a phosphinyl group, a phosphonato group, an alkyl ether group, an alkenylether group, an alkylthioether group, an alkenylthioether group, an arylether group, an arylthioether group and the like. The hydrogen atom included in the substituent can be substituted by a hydrocarbon group. The hydrocarbon group included in the abovementioned substituent can be either a straight chain, a branched chain, or cyclic.

When the imidazole compound represented by formula (1) has a substituent other than a hydrocarbon group, preferred examples of $R^1$, $R^2$, and $R^3$ include a halogen atom, a hydroxyl group, a mercapto group, a sulfide group, a cyano group, an isocyano group, a cyanato group, an isocyanato group, a thiocyanato group, an isothiocyanato group, a silyl group, a silanol group, an alkoxy group, an alkoxycarbonyl group, a carbamoyl group, a thiocarbamoyl group, a nitro group, a nitroso group, a carboxyl group, a carboxylate group, an acyl group, an acyloxy group, a sulfino group, a sulfonato group, a phosphino group, a phosphinyl group, a phosphonato group, an alkyl ether group, an alkenyl ether group, an alkylthio ether group, an alkenylthio ether group, an aryl ether group and an arylthio ether group.

As $R^1$, $R^2$, and $R^3$, a hydrogen atom, an alkyl group having 1 to 12 carbon atoms, an aryl group having 1 to 12 carbon atoms, an alkoxy group having 1 to 12 carbon atoms, and a halogen atom are preferable, and a hydrogen atom is more preferable. Since the imidazole compound where all of $R^1$, $R^2$ and $R^3$ are each a hydrogen atom has a simple structure with a small steric hindrance, a carbonyl group included in the imide group included in the (A) polyimide resin is easily attacked.

Component (B) is not particularly limited, as long as an imidazole compound represented by the above formula (1) is generated by the action of light. Compounds which can be used as component (B) are obtained by replacing the skeleton originating from amines which are generated upon exposure from the compounds which are conventionally contained in photosensitive resin compositions and generate amines by the action of light, with the skeleton originating from the imidazole compounds represented by the above formula (1).

Examples of the preferred component (B) include the compounds represented by the following formula (2):

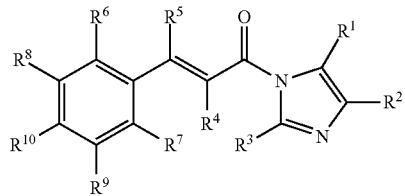

wherein, in the formula (2), $R^1$, $R^2$ and $R^3$ each independently represent a hydrogen atom, a halogen atom, a hydroxyl group, a mercapto group, a sulfide group, a silyl group, a silanol group, a nitro group, a nitroso group, a phosphino group, a sulfonato group, a phosphino group, a phosphinyl group, a phosphonato group, or an organic group; $R^4$ and $R^5$ each independently represent a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, or an organic group; $R^6$, $R^7$, $R^8$, $R^9$ and $R^{10}$ each independently represent a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, ammonio group, or an organic group; and two or more of $R^6$, $R^7$, $R^8$, $R^9$ and $R^{10}$ may join together to form a cyclic structure, or may include a bond of a hetero atom.

In the formula (2), $R^1$, $R^2$, and $R^3$ are the same as those explained regarding the formula (1).

In the formula (2), $R^4$ and $R^5$ represent respectively independently a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group or an organic group.

As the organic group in $R^4$ and $R^5$, those listed for $R^1$, $R^2$, and $R^3$ can be exemplified. The organic group can include a hetero atom, as in the case of $R^1$, $R^2$, and $R^3$. The organic group can be either a straight chain, a branched chain, or cyclic.

Among the above, $R^4$ and $R^5$ are preferably, respectively independently a hydrogen atom, an alkyl group having 1 to 10 carbon atoms, a cycloalkyl group having 4 to 13 carbon atoms, a cycloalkenyl group having 4 to 13 carbon atoms, an aryloxy alkyl group having 7 to 16 carbon atoms, an aralkyl group having 7 to 20 carbon atoms, an alkyl group having 2 to 11 carbon atoms substituted with a cyano group, an alkyl group having 1 to 10 carbon atoms substituted with a hydroxyl group, an alkoxy group having 1 to 10 carbon atoms, an amido group having 2 to 11 carbon atoms, an alkylthio group having 1 to 10 carbon atoms, an acyl group having 1 to 10 carbon atoms, an ester group (—COOR, —OCOR: R representing a hydrocarbon group) having 2 to 11 carbon atoms, an aryl group having 6 to 20 carbon atoms, an aryl group having 6 to 20 carbon atoms in which an electron donating group and/or an electron withdrawing group are substituted, a benzyl group in which an electron-donating group and/or an electron withdrawing group are substituted, a cyano group, and a methylthio group. More preferably, $R^4$ and $R^5$ are both hydrogen atoms; or $R^4$ is a methyl group and $R^5$ is a hydrogen atom.

In the formula (2), $R^6$, $R^7$, $R^8$, $R^9$, and $R^{10}$ represent respectively independently a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group.

As the organic group in $R^6$, $R^7$, $R^8$, $R^9$ and $R^{10}$, those listed for $R^1$, $R^2$, and $R^3$ can be exemplified. As in the case of $R^1$ and $R^2$, the organic group can include a bond other than a hydrocarbon group such as a hetero atom, or a substituent. The organic group can be either a straight chain, a branched chain, or cyclic.

At least two of $R^6$, $R^7$, $R^8$, $R^9$ and $R^{10}$ can bind to form a cyclic structure, and these can further include a bond of hetero atoms. As the cyclic structure, a heterocycloalkyl group, a heteroaryl group and the like can be exemplified, and the cyclic structure can also be a condensed ring. For example, $R^6$, $R^7$, $R^8$, $R^9$ and $R^{10}$ can form a condensed ring such as naphthalene, anthracene, phenanthrene, indene and the like, through bonding of at least two of these and sharing of an atom of a benzene ring to which $R^6$, $R^7$, $R^8$, $R^9$ and $R^{10}$ are bound.

Among the above, $R^6$, $R^7$, $R^8$, $R^9$ and $R^{10}$ are preferably, respectively independently a hydrogen atom, an alkyl group having 1 to 10 carbon atoms, a cycloalkyl group having 4 to 13 carbon atoms, a cycloalkenyl group having 4 to 13 carbon atoms, an aryloxy alkyl group having 7 to 16 carbon atoms, an aralkyl group having 7 to 20 carbon atoms, an alkyl group having 2 to 11 carbon atoms substituted with a cyano group, an alkyl group having 1 to 10 carbon atoms substituted with a hydroxyl group, an alkoxy group having 1 to 10 carbon atoms, an amido group having 2 to 11 carbon atoms, an alkylthio group having 1 to 10 carbon atoms, an acyl group having 1 to 10 carbon atoms, an ester group having 2 to 11 carbon atoms, an aryl group having 6 to 20 carbon atoms, an aryl group having 6 to 20 carbon atoms in which an electron donating group and/or an electron withdrawing group are substituted, a benzyl group in which an electron-donating group and/or an electron withdrawing group are substituted, a cyano group, a methylthio group and a nitro group.

A case where two or more of $R^6$, $R^7$, $R^8$, $R^9$ and $R^{10}$ join together to form a condensed ring such as naphthalene, anthracene, phenanthrene and indene by sharing the atoms of the benzene ring to which $R^6$, $R^7$, $R^8$, $R^9$ and $R^{10}$ are attached is preferred because the absorption wavelength is shifted toward a longer wavelength.

Among the compounds represented by the above formula (2), compounds represented by the following formula (3);

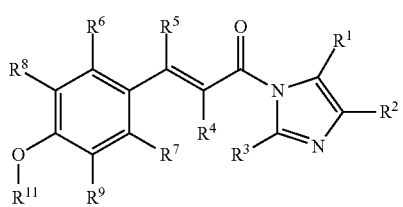

(3)

wherein, in the formula (3), $R^1$, $R^2$ and $R^3$ are used synonymously with those in formulas (1) and (2); $R^4$ to $R^9$ are used synonymously with those in formula (2); $R^{11}$ represents a hydrogen atom or an organic group; $R^6$ and $R^7$ shall not be a hydroxyl group; and two or more of $R^6$, $R^7$, $R^8$ and $R^9$ may join together to form a cyclic structure, or may include a bond of a hetero atom, are preferred.

The compounds represented by formula (3) have good solubility in organic solvents because they have a substituent —O—$R^{11}$.

In formula (3), $R^{11}$ is a hydrogen atom or an organic group. In a case where $R^{11}$ is an organic group, those exemplified with regard to $R^1$, $R^2$ and $R^3$ may be referred to as the organic group. This organic group may include a hetero atom in the organic group. This organic group may be any of linear, branched, or cyclic. For $R^{11}$, a hydrogen atom or an alkyl group having 1 to 12 carbon atoms is preferred, and a methyl group is more preferred.

Specific examples of the compounds particularly suitable for component (B) are shown below.

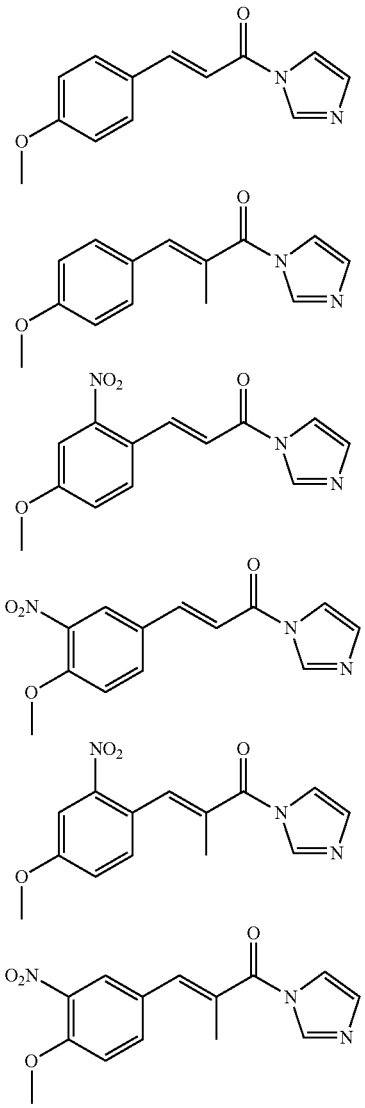

There is no particular limitation for the content of the component (B) in the positive photosensitive resin composition as long as it does not interfere with the object of the present invention. The content of component (B) in the positive photosensitive resin composition is preferably 1 to 50 parts by mass, more preferably 1 to 25 parts by mass, relative to 100 parts by mass of component (A).

(C) Organic Solvent

The photosensitive resin composition preferably comprises a (C) organic solvent (hereinafter also referred to as component (C)) from the perspective of application characteristics. When the positive photosensitive resin composition contains component (C), the positive photosensitive resin composition may be in a state of a paste containing a solid, or in a state of a solution, and preferably in a state of a solution. There is no particular limitation for the type of organic solvent as long as it does not interfere with the object of the present invention. Preferred examples of the organic solvent are the same as the examples of the organic solvent used in the reaction between tetracarboxylic dianhydride and diamine. The (C) organic solvent may include an alcohol solvent such as polyethylene glycol, ethylene glycol, diethylene glycol, propylene glycol, and dipropylene glycol. When the (C) organic solvent includes an alcohol solvent, a pattern which is good in heat resistance is likely to be formed.

The content of component (C) in the positive photosensitive resin composition is not particularly limited, within a range that does not inhibit objects of the present invention. The content of component (C) in the positive photosensitive resin composition is appropriately adjusted depending upon the solid content in the positive photosensitive resin composition. When the positive photosensitive resin composition contains component (C), the solid content of the positive photosensitive resin composition is between 5% and 50% by mass, and more preferably between 10% to 30% by mass.

(D) Other Component

The positive photosensitive resin composition may contain (D) other component, other than component (A), component (B) and component (C), described above. Examples of (D) other component include surfactants, plasticizers, viscosity modifiers, defoaming agents and coloring agents.

Besides component (B), the positive photosensitive resin composition may contain a compound which can generate a basic compound by the action of light (photo base generator) or a compound which can generate acid by the action of light (photo acid generator), for the purpose of adjusting pH value of the positive photosensitive resin composition at the time of exposure to an appropriate range. Depending on the amount ratio of tetracarboxylic dianhydride and diamine used for the synthesis of a polyimide resin which is component (A), the positive photosensitive resin composition may be more acidic or more basic than required. Also, it is desirable that the positive photosensitive resin composition is under a slightly basic condition during the exposure, so as to ensure that an imide-bond cleavage in the polyimide resin proceeds well during the exposure. In this regard, a condition of a positive photosensitive resin composition during the exposure can be adjusted to a slightly basic state by adding a photo base generator or a photo acid generator to the positive photosensitive resin composition.

As compounds which can generate basic compounds by the action of light, other than component (B), various compounds which have been used as a photo base generator in conventional photo sensitive resin compounds may be used. Among the compounds which can generate basic compounds by the action of light other than component (B), compounds represented by the following formula (4) are preferred.

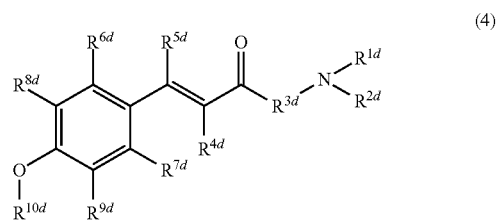

In the above formula (4), $R^{1d}$ and $R^{2d}$ each independently represent a hydrogen atom or an organic group, provided that at least one of $R^{1d}$ and $R^{2d}$ represents an organic group.

As the organic group in $R^{1d}$ and $R^{2d}$, an alkyl group, an alkenyl group, a cycloalkyl group, a cycloalkenyl group, an aryl group, an aralkyl group, and the like can be exemplified. The organic group can include a bond other than a hydrocarbon group such as a hetero atom, or a substituent. The organic group can be either a straight chain, a branched chain, or cyclic. The organic group is generally monovalent; however, can also be an organic group of divalent or more in a case of forming a cyclic structure or the like.

$R^{1d}$ and $R^{2d}$ may join together to form a non-aromatic heterocyclic ring. Examples of the non-aromatic heterocyclic ring formed by $R^{1d}$ and $R^{2d}$ joining together include piperidine, piperazine, morpholine and thiomorpholine.

A bond included in the organic group of $R^{1d}$ and $R^{2d}$ is not particularly limited as long as the effect of the present invention is not impaired. The organic group can include a bond including a hetero atom such as an oxygen atom, a nitrogen atom, a silicon atom and the like. Specific examples of the bond including a hetero atom include an ether bond, a thioether bond, a carbonyl bond, a thiocarbonyl bond, an ester bond, an amide bond, a urethane bond, an imino bond (—N=C(—R)—, —C(=NR)—: R representing a hydrogen atom or an organic group), a carbonate bond, a sulfonyl bond, a sulfinyl bond, an azo bond and the like.

As the bond including a hetero atom which can be included in the organic group of $R^{1d}$ and $R^{2d}$, an ether bond, a thioether bond, a carbonyl bond, a thiocarbonyl bond, an ester bond, an amide bond, a urethane bond, an imino bond (—N=C(—R)—, —C(=NR)—: R representing a hydrogen atom or a monovalent organic group), a carbonate bond, a sulfonyl bond, and a sulfinyl bond are preferable from the viewpoint of thermal resistance.

In a case in which $R^{1d}$ and $R^{2d}$ is an organic group, a substituent other than a hydrocarbon group, which the organic group may have, is not particularly limited as long as the effect of the present invention is not impaired. Specific examples of the substituent other than hydrocarbon group, which the organic group may have, include a halogen atom, a hydroxyl group, a mercapto group, a sulfide group, a cyano group, an isocyano group, a cyanato group, an isocyanato group, a thiocyanato group, an isothiocyanato group, a silyl group, a silanol group, an alkoxy group, an alkoxycarbonyl group, a carbamoyl group, a thiocarbamoyl group, a nitro group, a nitroso group, a carboxyl group, a carboxylate group, an acyl group, an acyloxy group, a sulfino group, a sulfonic group, a sulfonato group, a phosphino group, a phosphinyl group, a phosphonato group, a hydroxyimino group, an alkyl ether group, an alkenylether group, an alkylthioether group, an alkenylthioether group, an arylether group, an arylthioether group, amino group (—NH$_2$, —NHR, —NHRR': R and R' respectively representing a hydrocarbon group) and the like. The hydrogen atom included in the substituent can be substituted by a hydrocarbon group. The hydrocarbon group included in the above-mentioned substituent can be either a straight chain, a branched chain, or cyclic.

In a case in which the organic group of $R^{1d}$ and $R^{2d}$ is a substituent other than a hydrocarbon group, preferred examples of the substituent other than a hydrocarbon group, which the hydrocarbon group may have, include a halogen atom, a hydroxyl group, a mercapto group, a sulfide group, a cyano group, an isocyano group, a cyanato group, an isocyanato group, a thiocyanato group, an isothiocyanato group, a silyl group, a silanol group, an alkoxy group, an alkoxycarbonyl group, a carbamoyl group, a thiocarbamoyl group, a nitro group, a nitroso group, a carboxylate group, an acyl group, an acyloxy group, a sulfino group, a sulfonato group, a phosphino group, a phosphinyl group, a phosphonato group, an alkyl ether group, an alkenylether group, an alkylthioether group, an alkenylthioether group, an arylether group, an arylthioether group and the like. The hydrogen atom included in the substituent can be substituted by a hydrocarbon group.

Among the above-mentioned groups, preferably, at least one of $R^{1d}$ and $R^{2d}$ is an alkyl group having 1 to 12 carbon atoms or an aryl group having 1 to 12 carbon atoms, or $R^{1d}$ and $R^{2d}$ join together to form a heterocycloalkyl group having 2 to 20 carbon atoms. Examples of heterocycloalkyl group include a piperidino group, and a morpholino group.

In the above formula (4), $R^{3d}$ represents a single bond or an organic group.

Examples of the organic group with regard to $R^{3d}$ include those obtained by removing a hydrogen atom from alkyl groups, alkenyl groups, cycloalkyl groups, cycloalkenyl groups, aryl groups, or aralkyl groups, etc. These organic groups may include a substituent in the organic groups. Examples of the substituent include those exemplified for $R^{1d}$ and $R^{2d}$. These organic groups may be any of a linear or branched chain.

Among the above-mentioned groups, preferably, $R^{3d}$ is a single bond or a group obtained by removing a hydrogen atom from an alkyl group having 1 to 12 carbon atoms or an aryl group having 1 to 12 carbon atoms.

In the formula (4), $R^{4d}$ and $R^{5d}$ represent respectively independently a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, or an organic group.

Examples of the organic group with regard to $R^{4d}$ and $R^{5d}$ include those exemplified for $R^{1d}$ and $R^{2d}$. As in the case of $R^{1d}$ and $R^{2d}$, the organic group can include a bond other than a hydrocarbon group such as a hetero atom, or a substituent. The organic group can be either a straight chain, a branched chain, or cyclic.

Among the above, $R^{4d}$ and $R^{5d}$ are preferably, respectively independently a hydrogen atom, an alkyl group having 1 to 10 carbon atoms, a cycloalkyl group having 4 to 13 carbon atoms, a cycloalkenyl group having 4 to 13 carbon atoms, an aryloxy alkyl group having 7 to 16 carbon atoms, an aralkyl group having 7 to 20 carbon atoms, an alkyl group having 2 to 11 carbon atoms substituted with a cyano group, an alkyl group having 1 to 10 carbon atoms substituted with a hydroxyl group, an alkoxy group having 1 to 10 carbon atoms, an amido group having 2 to 11 carbon atoms, an alkylthio group having 1 to 10 carbon atoms, an acyl group having 1 to 10 carbon atoms, an ester group (—COOR, —OCOR: R indicating a hydrocarbon group) having 2 to 11 carbon atoms, an aryl group having 6 to 20 carbon atoms, an aryl group having 6 to 20 carbon atoms in which an electron donating group and/or an electron withdrawing group are substituted, a benzyl group in which an electron-donating group and/or an electron withdrawing group are substituted, a cyano group, and a methylthio group. More preferably, $R^6$ and $R^7$ are both hydrogen atoms; or $R^6$ is a methyl group and $R^7$ is a hydrogen atom.

In the formula (4), $R^{6d}$, $R^{7d}$, $R^{8d}$ and $R^{9d}$ represent respectively independently a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group.

As the organic group in $R^{6d}$, $R^{7d}$, $R^{8d}$ and $R^{9d}$, those listed for $R^{1d}$ and $R^{2d}$ can be exemplified. As in the case of $R^{1d}$ and $R^{2d}$, the organic group can include a bond other than a hydrocarbon group such as a hetero atom, or a substituent. The organic group can be either a straight chain, a branched chain, or cyclic.

Incidentally, $R^{6d}$ and $R^{7d}$ in the above formula (4) are not a hydroxyl group.

At least two of $R^{6d}$, $R^{7d}$, $R^{8d}$ and $R^{9d}$ can bind to form a cyclic structure, and these can further include a bond of hetero atoms. As the cyclic structure, a heterocycloalkyl group, a heteroaryl group and the like can be exemplified, and the cyclic structure can also be a condensed ring. For example, $R^{6d}$, $R^{7d}$, $R^{8d}$ and $R^{9d}$ can form a condensed ring such as naphthalene, anthracene, phenanthrene, indene and the like, through bonding of at least two of these and sharing of an atom of a benzene ring to which $R^{6d}$, $R^{7d}$, $R^{8d}$ and $R^{9d}$ are bound.

Among the above, $R^{6d}$, $R^{7d}$, $R^{8d}$ and $R^{9d}$ are preferably, respectively independently a hydrogen atom, an alkyl group having 1 to 10 carbon atoms, a cycloalkyl group having 4 to 13 carbon atoms, a cycloalkenyl group having 4 to 13 carbon atoms, an aryloxy alkyl group having 7 to 16 carbon atoms, an aralkyl group having 7 to 20 carbon atoms, an alkyl group having 2 to 11 carbon atoms substituted with a cyano group, an alkyl group having 1 to 10 carbon atoms substituted with a hydroxyl group, an alkoxy group having 1 to 10 carbon atoms, an amido group having 2 to 11 carbon atoms, an alkylthio group having 1 to 10 carbon atoms, an acyl group having 1 to 10 carbon atoms, an ester group (—COOR, —OCOR: R indicating a hydrocarbon group) having 2 to 11 carbon atoms, an aryl group having 6 to 20 carbon atoms, an aryl group having 6 to 20 carbon atoms in which an electron donating group and/or an electron withdrawing group are substituted, a benzyl group in which an electron-donating group and/or an electron withdrawing group are substituted, a cyano group, a methylthio group and a nitro group.

Two or more of $R^{6d}$, $R^{7d}$, $R^{8d}$ and $R^{9d}$ may join to form a condensed ring such as naphthalene, anthracene, phenanthrene and indene by sharing the atoms of the benzene ring to which $R^{6d}$, $R^{7d}$, $R^{8d}$ and $R^{9d}$ are attached.

More preferably, $R^{6d}$, $R^{7d}$, $R^{8d}$ and $R^{9d}$ are all hydrogen atoms, or either one of $R^{6d}$, $R^{7d}$, $R^{8d}$ and $R^{9d}$ is a nitro group and the other three are hydrogen atoms.

In the above formula (4), $R^{10d}$ represents a hydrogen atom or an organic group.

Examples of the organic group with regard to $R^{10d}$ include those exemplified for $R^{1d}$ and $R^{2d}$. The organic group may include a bond other than hydrocarbon groups such as a hetero atom, or a substituent, in the organic group, as is the case in $R^{1d}$ and $R^{2d}$. The organic group may be any of a linear, branched or cyclic. The compounds represented by the above formula (4) have good solubility in solvents because the compounds have an —OR$^{10d}$ group at the para-position in a benzene ring.

Among those described above, the R$^{10d}$ group is preferably a hydrogen atom or an alkyl group having 1 to 12 carbon atoms, more preferably, a methyl group.

Examples of the particularly preferred compounds represented by the above formula (4) include the compounds represented by the following formulas.

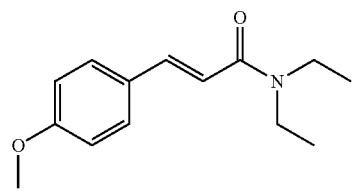
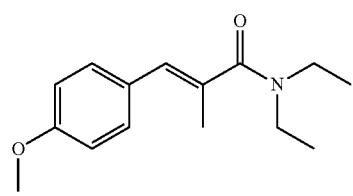
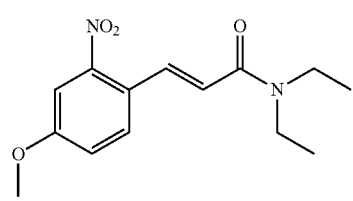
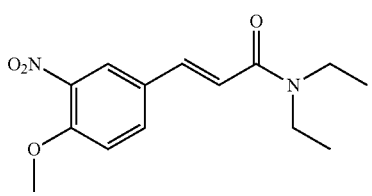
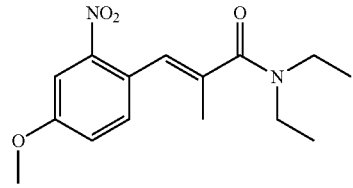
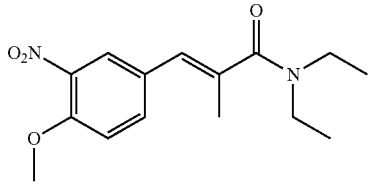
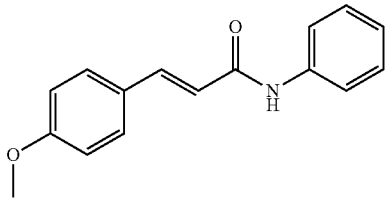

-continued

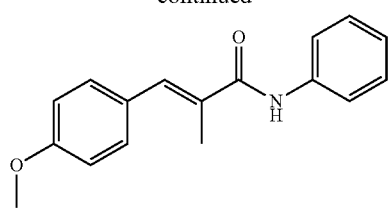
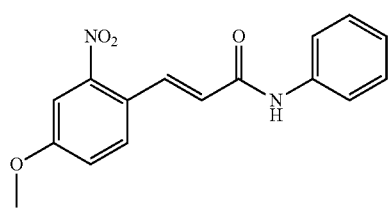
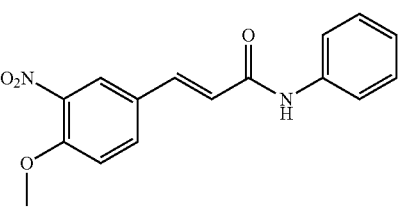
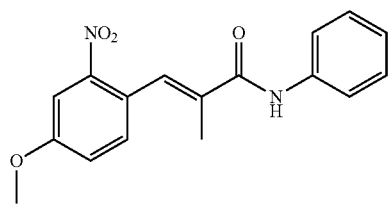
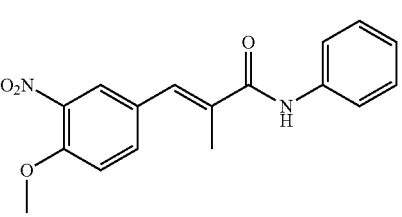
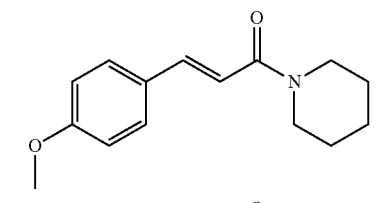
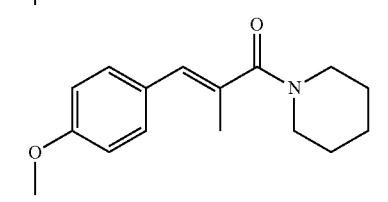
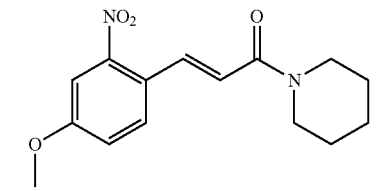

-continued

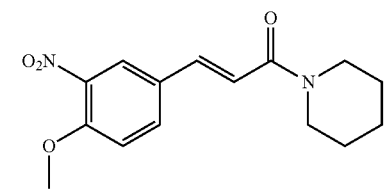
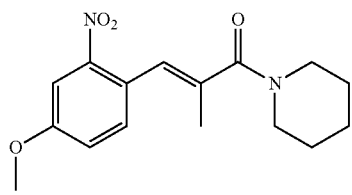
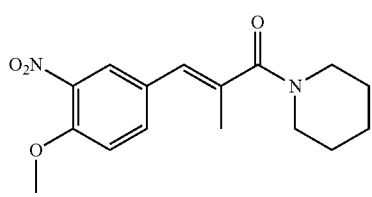
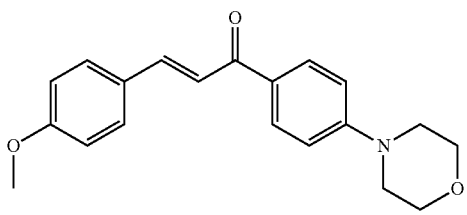
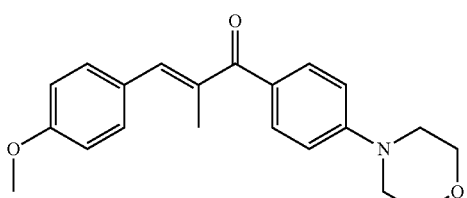
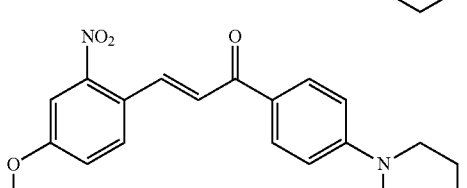
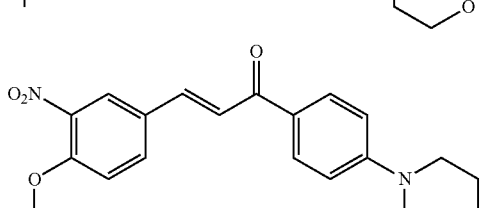
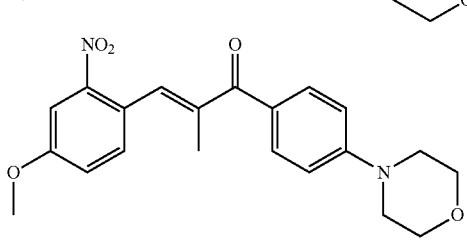

-continued

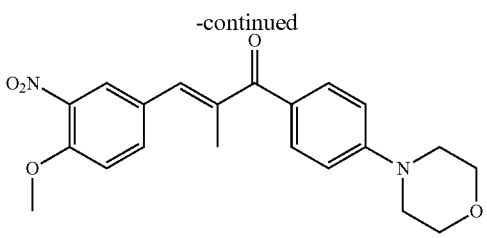

The compounds represented by the following formula (5) are also preferred as the compound which can generate basic compounds by the action of light other than component (B).

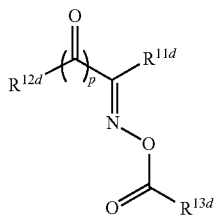

(5)

In the above formula (5), $R^{11d}$ represents an alkyl group having 1 to 10 carbon atoms or an optionally substituted phenyl group. p is 0 or 1. $R^{12d}$ represents an optionally substituted phenyl group or an optionally substituted carbazolyl group. $R^{13d}$ represents a hydrogen atom, an alkyl group having 1 to 6 carbon atoms or an optionally substituted phenyl group.

In a case where $R^{11d}$ is an alkyl group having 1 to 10 carbon atoms, the alkyl group may be linear or branched. In this case, the alkyl group preferably has 1 to 8 carbon atoms, more preferably 1 to 5 carbon atoms.

In a case where $R^{11d}$ is an optionally substituted phenyl group, there is no particular limitation for substituents as long as they do not interfere with the object of the present invention. Suitable examples of the substituents which a phenyl group may have include an alkyl group, an alkoxy group, a cycloalkyl group, a cycloalkoxy group, a saturated aliphatic acyl group, an alkoxycarbonyl group, a saturated aliphatic acyloxy group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an amino group, an amino group substituted with 1 or 2 organic groups, a morpholine-1-yl group, and a piperazine-1-yl group, halogen, a nitro group, and a cyano group and the like. When $R^{11d}$ is an optionally substituted phenyl group, and the phenyl group has two or more substituents, the two or more substituents may be the same, or may be different.

In a case where a substituent on the phenyl group is an alkyl group, the number of carbon atoms of the substituent is preferably 1 to 20, more preferably 1 to 6. The alkyl group may be linear chain or branched. In a case where a substituent on the phenyl group is an alkyl group, specific examples of the alkyl group include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group and the like. The alkyl group may include an ether bond (—O—) in the carbon chain. Examples of the alkyl group having an ether bond in the carbon chain include a methoxyethyl group, an ethoxyethyl group, a methoxyethoxyethyl group, an ethoxyethoxyethyl group, a propyloxyethoxyethyl group, a methoxypropyl group and the like.

In a case where a substituent on the phenyl group is an alkoxy group, the number of carbon atoms of the substituent is preferably 1 to 20, more preferably 1 to 6. The alkoxy group may be linear chain or branched. In a case where a substituent on the phenyl group is an alkoxy group, specific examples of the alkoxy group include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, an isodecyloxy group and the like. The alkoxy group may include an ether bond (—O—) in the carbon chain. Examples of the alkoxy group having an ether bond in the carbon chain include a methoxyethoxy group, an ethoxyethoxy group, a 2-methoxy-1-methylethoxy group, a methoxyethoxyethoxy group, an ethoxyethoxyethoxy group, a propyloxyethoxyethoxy group, a methoxypropyloxy group and the like.

In a case where a substituent on the phenyl group is a cycloalkyl group or a cycloalkoxy group, the number of carbon atoms of the substituent is preferably 3 to 10, more preferably 3 to 6. In a case where a substituent on the phenyl group is a cycloalkyl group, specific examples of the cycloalkyl group include a cyclopropyl group, a cyclobutyl group, a cyclopentyl group, a cyclohexyl group, a cycloheptyl group, a cyclooctyl group and the like. In a case where a substituent on the phenyl group is a cycloalkoxy group, specific examples of the cycloalkoxy group include a cyclopropyloxy group, a cyclobutyloxy group, a cyclopentyloxy group, a cyclohexyloxy group, a cycloheptyloxy group, a cyclooctyloxy group and the like.

In a case where a substituent on the phenyl group is a saturated aliphatic acyl group or a saturated aliphatic acyloxy group, the number of carbon atoms of the substituent is preferably 2 to 20, more preferably 2 to 7. In a case where a substituent on the phenyl group is a saturated aliphatic acyl group, specific examples of the saturated aliphatic acyl group include an acetyl group, a propanoyl group, an n-butanoyl group, a 2-methylpropanoyl group, an n-pentanoyl group, a 2,2-dimethylpropanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, an n-hexadecanoyl group and the like. In a case where a substituent on the phenyl group is a saturated aliphatic acyloxy group, specific examples of the saturated aliphatic acyloxy group include an acetyloxy group, a propanoyloxy group, an n-butanoyloxy group, a 2-methylpropanoyloxy group, an n-pentanoyloxy group, a 2,2-dimethylpropanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, an n-hexadecanoyloxy group and the like.

In a case where a substituent on the phenyl group is an alkoxycarbonyl group, the number of carbon atoms of the substituent is preferably 2 to 20, more preferably 2 to 7. In a case where a substituent on the phenyl group is an alkoxycarbonyl group, specific examples of the alkoxycarbonyl group include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n-octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, an isodecyloxycarbonyl group and the like.

In a case where a substituent on the phenyl group is a phenylalkyl group, the number of carbon atoms of the substituent is preferably 7 to 20, more preferably 7 to 10. In a case where a substituent on the phenyl group is a naphthylalkyl group, the number of carbon atoms of the substituent is preferably 11 to 20, more preferably 11 to 14. In a case where a substituent on the phenyl group is a phenylalkyl group, specific examples of the phenylalkyl group include a benzyl group, a 2-phenylethyl group, a 3-phenylpropyl group and a 4-phenylbutyl group. In a case where a substituent on the phenyl group is a naphthylalkyl group, specific examples of the naphthylalkyl group include an α-naphthylmethyl group, a β-naphthylmethyl group, a 2-(α-naphthyl)ethyl group and a 2-(β-naphthyl)ethyl group. In a case where a substituent on the phenyl group is a phenylalkyl group or a naphthylalkyl group, the substituent may further have a substituent on the phenyl group or the naphthyl group.

In a case where a substituent on the phenyl group is a heterocyclyl group, the heterocyclyl group is a 5 or 6-membered monocyclic ring having one or more N, S and O, or a heterocyclyl group in which the above monocyclic rings are condensed together, or the above monocyclic ring and a benzene ring are condensed. In a case where the heterocyclyl group is a condensed ring, the number of rings shall be up to 3. Heterocyclic rings contained in the above heterocyclyl group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, quinoxaline and the like. In a case where a substituent on the phenyl group is a heterocyclyl group, the heterocyclyl group may further have a substituent.

In a case where a substituent on the phenyl group is an amino group substituted with 1 or 2 organic groups, suitable examples of the organic group include an alkyl group having 1 to 20 carbon atoms, a cycloalkyl group having 3 to 10 carbon atoms, a saturated aliphatic acyl group having 2 to 20 carbon atoms, a saturated aliphatic acyloxy group having 2 to 20 carbon atoms, an optionally substituted phenyl group, an optionally substituted benzoyl group, an optionally substituted phenylalkyl group having 7 to 20 carbon atoms, an optionally substituted naphthyl group, an optionally substituted naphthoyl group, an optionally substituted naphthylalkyl group having 11 to 20 carbon atoms, a heterocyclyl group and the like. Specific examples of these suitable organic groups similarly include those described for the substituents on the phenyl group. Specific examples of the amino group substituted with 1 or 2 organic groups include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, a propanoylamino group, an n-butanoylamino group, n-pentanoylamino group, an n-hexanoylamino group, an n-heptanoylamino group, an n-octanoylamino group, an n-decanoylamino group, a benzoylamino group, an α-naphthoylamino group, a β-naphthoylamino group and the like.

In a case where the phenyl group, the naphthyl group and the heterocyclyl group included in the substituent on the phenyl group further have a substituent, examples of the substituent include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group with 1 to 6 carbon atoms, a dialkylamino group having alkyl groups with 1 to 6 carbon atoms, a morpholine-1-yl group, a piperazine-1-yl group, halogen, a nitro group, a cyano group and the like. In a case where the phenyl group, the naphthyl group and the heterocyclyl group included in the substituent on the phenyl group further have a substituent, the number of the substituent is preferably, but not limited to, 1 to 4 as long as it does not interfere with the object of the present invention. In a case where the phenyl group, the naphthyl group and the heterocyclyl group included in the substituent on the phenyl group have two or more substituents, the two or more substituents may be the same, or may different.

Among these substituents, alkoxy groups or alkoxyalkyl groups are preferred. In a case where a substituent on the phenyl group is an alkyl group, the number of carbon atoms of the substituent is preferably 1 to 10, more preferably 1 to 6, particularly preferably 1 to 3, and most preferably 1. In a case where a substituent on a phenyl group is an alkoxyalkyl group, the group represented by $-R^{14d}-O-R^{15d}$ is preferred. $R^{14d}$ is an alkylene group which may be a linear or branched chain having 1 to 10 carbon atoms. $R^{15d}$ is an alkyl group having 1 to 10 carbon atoms which may be a linear or branched chain. The number of carbon atoms of $R^{14d}$ is preferably 1 to 8, more preferably 1 to 5, and particularly preferably 1 to 3. The number of carbon atoms of $R^{15d}$ is preferably 1 to 8, more preferably 1 to 5, particularly preferably 1 to 3, and the most preferably 1.

In a case where $R^{11d}$ is an optionally substituted phenyl group, there is no particular limitation for the number of substituents and a position at which a substituent is attached as long as they do not interfere with the object of the present invention. In a case where $R^{11d}$ is an optionally substituted phenyl group, the optionally substituted phenyl group is preferably an optionally substituted o-tolyl group in view of excellent efficacy of base generation.

$R^{12d}$ is a phenyl group which may have a substituent, or a carbazolyl group which may have a substituent. When $R^{12d}$ is a carbazolyl group which may have a substituent, the nitrogen atom on the carbazolyl group may be substituted with an alkyl group having 1 to 6 carbon atoms.

For $R^{12d}$, there is no particular limitation for substituents of the phenyl group or the carbazolyl group as long as they do not interfere with the object of the present invention. Examples of suitable substituents which the phenyl group or carbazolyl group may have on the carbon atom include an alkyl group having 1 to 20 carbon atoms, an alkoxy group having 1 to 20 carbon atoms, a cycloalkyl group having 3 to 10 carbon atoms, a cycloalkoxy group having 3 to 10 carbon atoms, a saturated aliphatic acyl group having 2 to 20 carbon atoms, an alkoxycarbonyl group having 2 to 20 carbon atoms, a saturated aliphatic acyloxy group having 2 to 20 carbon atoms, an optionally substituted phenyl group, an optionally substituted phenoxy group, an optionally substituted phenylthio group, an optionally substituted benzoyl group, an optionally substituted phenoxycarbonyl group, an optionally substituted benzoyloxy group, an optionally substituted phenylalkyl group having 7 to 20 carbon atoms, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group having 11 to 20 carbon atoms, an optionally substituted heterocyclyl group, an optionally substituted heterocyclylcarbonyl group, an amino group, an amino group substituted with 1 or 2 organic groups, a morpholine-1-yl group, a piperazine-1-yl group, halogen, a nitro group, a cyano group and the like.

In a case where $R^{12d}$ is a carbazolyl group, examples of suitable substituent which the carbazolyl group may have on the nitrogen atom include an alkyl group having 1 to 20 carbon atoms, a cycloalkyl group having 3 to 10 carbon atoms, a saturated aliphatic acyl group having 2 to 20 carbon atoms, an alkoxycarbonyl group having 2 to 20 carbon atoms, an optionally substituted phenyl group, an optionally substituted benzoyl group, an optionally substituted phenoxycarbonyl group, an optionally substituted phenylalkyl group having 7 to 20 carbon atoms, an optionally substituted naphthyl group, an optionally substituted naphthoyl group, an optionally substituted naphthoxycarbonyl group, an optionally substituted naphthylalkyl group having 11 to 20 carbon atoms, an optionally substituted heterocyclyl group, an optionally substituted heterocyclylcarbonyl group and the like. Among these substituents, an alkyl group having 1 to 20 carbon atoms is preferred, and an alkyl group having 1 to 6 carbon atoms is more preferred, and in particular an ethyl group is preferred.

For an alkyl group, an alkoxy group, a cycloalkyl group, a cycloalkoxy group, a saturated aliphatic acyl group, an alkoxycarbonyl group, a saturated aliphatic acyloxy group, an optionally substituted phenylalkyl group, an optionally substituted naphthylalkyl group, an optionally substituted heterocyclyl group and an amino group substituted with 1 or 2 organic groups, specific examples of optional substituents on the phenyl group or the carbazolyl group are similar to the examples of the substituents on the phenyl group in a case where $R^{11d}$ is an optionally substituted phenyl group.

In a case where the phenyl group, the naphthyl group and the heterocyclyl group included in the substituent on the phenyl group or the carbazolyl group in $R^{12d}$ further have a substituent, examples of the substituent include an alkyl group having 1 to 6 carbon atoms; an alkoxy group having 1 to 6 carbon atoms; a saturated aliphatic acyl group having 2 to 7 carbon atoms; an alkoxycarbonyl group having 2 to 7 carbon atoms; a saturated aliphatic acyloxy group having 2 to 7 carbon atoms; a phenyl group; a naphthyl group; a benzoyl group; a naphthoyl group; a benzoyl group substituted with a group selected from the group consisting of an alkyl group having 1 to 6 carbon atoms, a morpholine-1-yl group, a piperazine-1-yl group and a phenyl group; a monoalkylamino group having an alkyl group having 1 to 6 carbon atoms; a dialkylamino group having alkyl groups having 1 to 6 carbon atoms; a morpholine-1-yl group; a piperazine-1-yl group; halogen; a nitro group; and a cyano group. In a case where the phenyl group, the naphthyl group and the heterocyclyl group included in the substituent on the phenyl group or the carbazolyl group further have a substituent, the number of the substituent is not limited as far as objects of the present invention are not inhibited, but 1 to 4 is preferred. In a case where the phenyl group, the naphthyl group and the heterocyclyl group have multiple substituents, the substituents may be different from or the same as each other.

From a viewpoint of efficiency of base generation of the compounds represented by formula (5), as $R^{12d}$, the groups represented by the following formula (6):

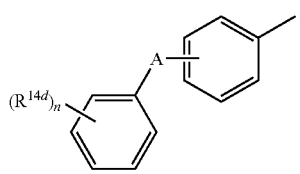

(6)

or the groups represented by the following formula (7):

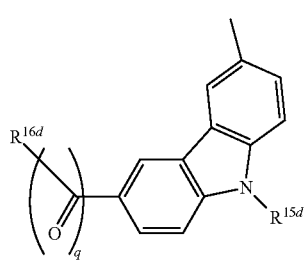

(7)

are preferred.

In formula (6), $R^{14d}$ is a group selected from the group consisting of a monovalent organic group, an amino group, halogen, a nitro group and a cyano group; A is S or O; and n is an integer between 0 and 4. In formula (7), $R^{15d}$ and $R^{16d}$ each are a monovalent organic group, and q is 0 or 1.

When $R^{14d}$ in formula (6) is an organic group, $R^{14d}$ can be selected from various kinds of organic groups as far as objects of the present invention are not inhibited. Preferred examples when $R^{14d}$ is an organic group in formula (6) include alkyl groups having 1 to 6 carbon atoms; alkoxy groups having 1 to 6 carbon atoms; saturated aliphatic acyl groups having 2 to 7 carbon atoms; alkoxycarbonyl groups having 2 to 7 carbon atoms; saturated aliphatic acyloxy groups having 2 to 7 carbon atoms; a phenyl group; a naphthyl group; a benzoyl group; a naphthoyl group; benzoyl groups substituted with a group selected from the group consisting of an alkyl group having 1 to 6 carbon atoms, a morpholine-1-yl group, a piperazine-1-yl group and a phenyl group; monoalkylamino groups having an alkyl group having 1 to 6 carbon atoms; dialkylamino groups having alkyl groups having 1 to 6 carbon atoms; a morpholine-1-yl group; a piperazine-1-yl group; halogen; a nitro group; and a cyano group.

Among $R^{14d}$, a benzoyl group; a naphthoyl group; benzoyl groups substituted with a group selected from the group consisting of an alkyl group having 1 to 6 carbon atoms, a morpholine-1-yl group, a piperazine-1-yl group, and a phenyl group; and a nitro group are preferred, and a benzoyl group; a naphthoyl group; a 2-methylphenyl carbonyl group; a 4-(piperazine-1-yl) phenyl carbonyl group; and a 4-(phenyl) phenyl carbonyl group are more preferred.

In formula (6), n is preferably an integer between 0 and 3, more preferably an integer between 0 and 2, and particularly preferably 0 or 1. When n is 1, the position at which $R^{14d}$ bonds is preferably the para-position to the bonding through which the phenyl group (to which $R^{14d}$ bonds) bonds to a sulfur atom.

$R^{15d}$ in the formula (7) can be selected from various organic groups as long as they do not interfere with the object of the present invention. Suitable examples of $R^{15d}$ include an alkyl group having 1 to 20 carbon atoms, a cycloalkyl group having 3 to 10 carbon atoms, a saturated aliphatic acyl group having 2 to 20 carbon atoms, an alkoxycarbonyl group having 2 to 20 carbon atoms, an optionally substituted phenyl group, an optionally substituted benzoyl group, an optionally substituted phenoxycarbonyl group, an optionally substituted phenylalkyl group having 7 to 20 carbon atoms, an optionally substituted naphthyl group, an optionally substituted naphthoyl group, an optionally substituted naphthoxycarbonyl group, an optionally substituted naphthylalkyl group having 11 to 20 carbon atoms, an optionally substituted heterocyclyl group, an optionally substituted heterocyclylcarbonyl group and the like.

Among these, $R^{15d}$ is preferably an alkyl group having 1 to 20 carbon atoms, more preferably an alkyl group having 1 to 6 carbon atoms, and in particular preferably an ethyl group.

There is no particular limitation for $R^{16d}$ in the formula (7) as long as they do not interfere with the object of the present invention, and it can be selected from various organic groups. Specific examples of the suitable group for $R^{16d}$ include an alkyl group having 1 to 20 carbon atoms, an optionally substituted phenyl group, an optionally substituted naphthyl group and an optionally substituted heterocyclyl group. Among these groups, $R^{16d}$ is more preferably an optionally substituted phenyl group, and in particular preferably a 2-methylphenyl group.

In a case where the phenyl group, the naphthyl group and the heterocyclyl group included in $R^{14d}$, $R^{15d}$ or $R^{16d}$ further have a substituent, substituents include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group with 1 to 6 carbon atoms, a dialkylamino group having alkyl groups with 1 to 6 carbon atoms, a morpholine-1-yl group, a piperazine-1-yl group, halogen, a nitro group, a cyano group and the like. In a case where the phenyl group, the naphthyl group and the heterocyclyl group included in $R^{14d}$, $R^{15d}$ or $R^{16d}$ further have a substituent, there is no particular limitation for the number of the substituent as long as it does not interfere with the object of the present invention, but it is preferably 1 to 4. In a case where the phenyl group, the naphthyl group and the heterocyclyl group included in $R^{14d}$, $R^{15d}$ or $R^{16d}$ have two or more substituents, the two or more substituents may be the same, or may be different.

$R^{13d}$ represents a hydrogen atom, an alkyl group having 1 to 6 carbon atoms or an optionally substituted phenyl group. For an optionally substituted phenyl group, optional substituents on the phenyl group are similar to those in a case where $R^{11d}$ is an optionally substituted phenyl group. For $R^{13d}$, a methyl group, an ethyl group or a phenyl group is preferred, and a methyl group or a phenyl group is more preferred.

The oxime ester compound represented by the above formula (5) wherein p is 0 can be synthesized, for example, by the method described below. First, a ketone compound represented by $R^{12d}$—CO—$R^{11d}$ is subjected to oximation with hydroxylamine to obtain an oxime compound represented by $R^{12d}$—(C=N—OH)—$R^{11d}$. Subsequently, the resulting oxime compound is acylated with an acid halide represented by $R^{13d}$—CO-Hal (Hal represents halogen) or an acid anhydride represented by $(R^{13d}CO)_2O$ to obtain an oxime ester compound represented by the above formula (5) wherein p is 0.

The oxime ester compound represented by the above formula (5) wherein p is 1 can be synthesized, for example, by the method described below. First, a ketone compound represented by $R^{12d}$—CO—$CH_2$—$R^{11d}$ is allowed to react with a nitrous ester in the presence of hydrochloric acid to obtain an oxime compound represented by $R^{12d}$—CO—(C=N—OH)—$R^{11d}$. Subsequently, the resulting oxime compound is acylated with an acid halide represented by $R^{13d}$—CO-Hal (Hal represents halogen) or an acid anhydride represented by $(R^{13d}CO)_2O$ to obtain an oxime ester compound represented by the above formula (5) wherein p is 1.

The preferred examples among the oxime ester compounds represented by the above formula (5), as explained above, include the following compounds.

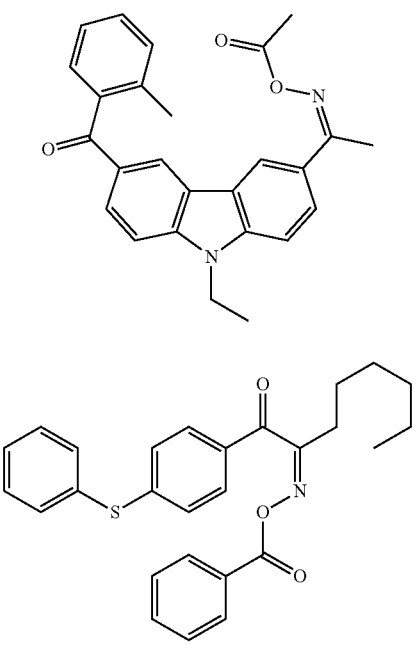

Photo acid generators are not particularly limited, and various generators may be used. Examples of the preferred photo acid generators include already-known acid generators including onium salts, diazomethane derivatives, glyoxime derivatives, bissulfone derivatives, β-keto sulfone derivatives, disulfone derivatives, nitro benzyl sulfonate derivatives, sulfonic acid ester derivatives and sulfonate derivatives of N-hydroxyimide compounds.

The amounts to be used of a photo base generator and a photo acid generator are not particularly limited, as long as a positive photosensitive resin composition which is capable of forming a desired pattern is obtained. The preferred amounts to be used of a photo base generator and a photo acid generator are appropriately adjusted depending upon the amounts of an acidic group or a basic group which the polyimide resin contained in the positive photosensitive resin composition possesses.

The positive photosensitive resin composition according to the first aspect is obtained by combining each of the components as described above in a predetermined ratio.

Method of Forming a Polyimide Resin Pattern

The method of forming a polyimide resin pattern according to the second aspect includes:

a coating film-forming step of forming a coating film of the positive photosensitive resin composition according to the first aspect;

an exposure step of exposing the coating film to a predetermined pattern; and a development step of removing the exposed portions of the exposed coating film for development. Below, each step will be explained.

Coating Film-Forming Step

In the coating film-forming step, the positive photosensitive resin composition according to the first aspect is applied to the surface of an object to be coated to form a coating film. Examples of application methods include a dipping method, a spraying method, a bar coating method, a roll coating method, a spin coating method, and a curtain coating method. The thickness of a coating film is not particularly limited. Typically, the thickness of the coating film is preferably between 2 to 100 μm, and more preferably 3 to 50 μm. The thickness of a coating film can be appropriately controlled by means of application method or by adjusting a solid content or a viscosity of a positive photosensitive resin composition.

After applying the positive photosensitive resin composition to an object to be coated, the coating film may be heated in order to remove the solvent included in the coating film. The heating temperature or the heating time of the coating film is not particularly limited, as far as no heat deterioration or thermal decomposition is caused in the components contained in the positive photosensitive resin composition. In a case where the boiling point of a solvent in the coating film is high, the coating film may be heated under reduced pressure.

Exposure Step

The coating film obtained in the coating film-forming step is selectively exposed to a predetermined pattern. Selective exposure is usually carried out using a mask of a predetermined pattern. Examples of radiation used for the exposure include, for example, ultraviolet rays, electron beams, laser beams and the like emitted from a low-pressure mercury lamp, a high-pressure mercury lamp, a metal halide lamp, a g-line stepper, an i-line stepper and the like. The amount of exposure may vary depending on the light source to be used or the thickness of a coating film and the like, but is usually 1 to 1000 mJ/cm$^2$, and preferably 10 to 500 mJ/cm$^2$.

Development Step

In the development step, the exposed portions are removed from the coating film which has been exposed selectively to a predetermined pattern in the exposure step, so as to develop a polyimide resin pattern. The exposed portions are usually removed by dissolving in an alkaline developing solution. Examples of developing methods include a shower developing method, a spray developing method, a dipping developing method, and a paddle developing method. As an alkaline developing solution, an aqueous solution containing one or more alkali compounds selected from inorganic alkali compounds and organic alkali compounds can be used. The concentration of an alkali compound in a developing solution is not particularly limited, as long as the developing solution can satisfactorily develop a coating film after the exposure. Typically, the concentration of an alkali compound in a developing solution is preferably between 1 and 10% by mass.

Examples of the inorganic alkali compounds include lithium hydroxide, sodium hydroxide, potassium hydroxide, diammonium hydrogen phosphate, dipotassium hydrogen phosphate, disodium hydrogen phosphate, lithium silicate, sodium silicate, potassium silicate, lithium carbonate, sodium carbonate, potassium carbonate, lithium borate, sodium borate, potassium borate and ammonia. Examples of the organic alkali compounds include tetramethylammonium hydroxide, tetraethylammonium hydroxide, trimethylhydroxyethylammonium hydroxide, methylamine, dimethylamine, trimethylamine, monoethylamine, diethylamine, triethylamine, n-propylamine, di-n-propylamine, isopropylamine, diisopropylamine, methyldiethylamine, dimethylethanolamine, ethanolamine and triethanolamine.

Further, in the developing solution, appropriate amounts of water-soluble organic solvents such as methanol, ethanol, propanol or ethylene glycol, a surfactant, a preservation stabilizer and a resin-dissolution suppressing agent can be added, as needed.

After the development step, the developed polyimide resin film is rinsed with water, etc., as needed, and subsequently dried with pressurized air or compressed nitrogen, and thereby a polyimide resin pattern is obtained.

EXAMPLES

Below, the present invention will be described more specifically by way of Examples, but the present invention is not limited to these Examples.

Preparation Example 1

To a glass reaction vessel equipped with a reflux condenser, 14.71 g (0.05 mol) of 3,3',4,4'-biphenyltetracarboxylic dianhydride, 10.01 g (0.05 mol) of 4,4'-diaminodiphenyl ether, and 181.30 g of N-methyl-2-pyrolidone were added. The content of the reaction vessel was heated from room temperature to 160° C. over one hour to cause polymerization and imidation to proceed so as to obtain a first-polymerization liquid. The imidation ratio of the polyimide contained in the first-polymerization solution was 90% or higher and a logarithmic viscosity was 1.02. A rotational viscosity at 140° C. of the first-polymerization solution was 1.1 Pa·s.

To an autoclave where an inner surface of its vessel was coated with glass, 11 g (about 8 ml) of the obtained first-polymerization solution was added and the gas phase in the autoclave was replaced with nitrogen. Subsequently, the autoclave was sealed and then the first-polymerization solution was heated to 180° C. to perform second-polymerization, so as to obtain polyimide resin solution 1 (PI-1).

Preparation Example 2

Polyimide resin solution 2 (PI-2) was obtained in the same manner as in Preparation Example 1, except that 14.71 g (0.05 mol) of 3,3',4,4'-biphenyltetracarboxylic dianhydride was replaced with 10.91 g (0.05 mol) of pyromellitic dianhydride and the amount to be used of N-methyl-2-pyrolidone was changed from 181.30 g to 153.43 g.

Examples 1 to 4 and Comparative Example 1 to 5

In the Examples and the Comparative Examples, as the compound that generates a basic compound by the action of light (photo base generator, PBG) or the compound that generates acid by the action of light (photo acid generator, PAG), the following PBG1 to PBG4 and PAG1 were used.

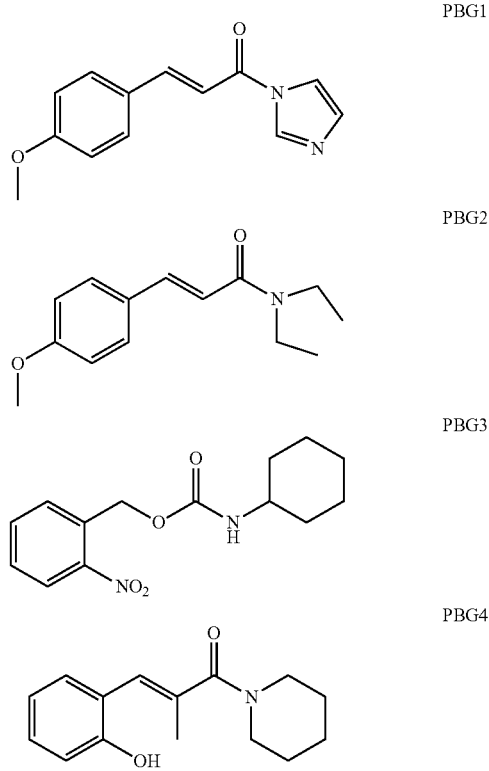

PAG1

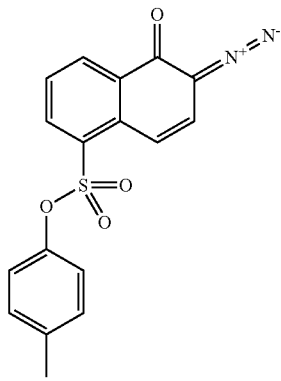

PBG5

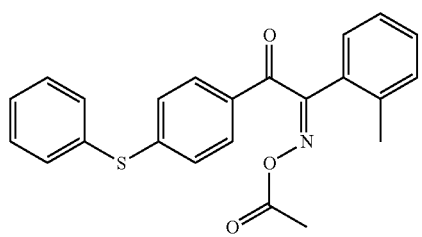

Examples 1 to 4 and Comparative Examples 1 to 5

3 grams of a photo base generator or a photo acid generator of the kinds described in Table 1 were dissolved in 100 g of a polyimide resin solution of the kinds disclosed in Table 1. The obtained solution was filtered using a filter with a pore size of 5 μm so as to obtain a photosensitive resin composition. Incidentally, in Example 3, 3 g of PBG1 and 0.5 g of PBG5 were used as the photo base generator. In Example 4, 0.5 g of polyethylene glycol was further added to the polyimide resin solution. Evaluations as to the pattern formation and heat resistance of the pattern were performed by using the obtained photo sensitive resin compositions.

Evaluation of Pattern Formation

The photo sensitive resin composition was spin coated on a silicon wafer, prebaked at 100° C. for 300 seconds to obtain a coating film with a film thickness of 5 μm. Exposure for 100 seconds was performed with an ultra high-pressure mercury lamp (200 mW/cm²) using a mask of line and space pattern. The exposed coating film was dipped in the developing solution (aqueous TMAH solution, concentration: 2.38% by mass) to perform development. Subsequently, the developed coating film was rinsed with water and dried. The coating film after the development was observed and the performance of pattern formation of the photo sensitive resin composition was evaluated according to the following criteria.

Very good: Line with a width of 20 μm or less was formed.

Good: Line with a width of more than 20 μm and 300 μm or less was formed.

Bad: Line with a width of 300 μm or less was not formed or the coating film after exposure could not be dissolved in a developing solution.

Evaluation of Heat Resistance of Pattern

In the evaluation of pattern formation, a sample scraped off from a polyimide resin film which was subjected to the development treatment was used.

5 μg of the polyimide resin sample was analyzed on a differential thermal/thermogravimetry instrument (TG/DTA-6200, manufactured by Seiko Instruments Inc.) and a thermogravimetric reduction curve was obtained. From the resulting thermogravimetric reduction curve, a 5% thermogravimetric reduction temperature was obtained. A case where the 5% thermogravimetric reduction temperature was lower than 300° C. was evaluated as bad, a case where it was 300° C. or higher and lower than 350° C. was evaluated as good; and a case where it was 350° C. or higher was evaluated as very good.

TABLE 1

| | Polyimide resin solution | Photo base generator or photo acid generator | Evaluation of pattern formation | Evaluation of heat resistance |
|---|---|---|---|---|
| Example 1 | PI-1 | PBG1 | Very Good | Very Good |
| Example 2 | PI-2 | PBG1 | Good | Very Good |
| Example 3 | PI-1 | PBG1 PBG5 | Very Good | Good |
| Example 4 | PI-1 | PBG1 | Very Good | Very Good |
| Comparative example 1 | PI-1 | PBG2 | Bad | Good |
| Comparative example 2 | PI-1 | PBG3 | Bad | Bad |
| Comparative example 3 | PI-1 | PBG4 | Bad | Bad |
| Comparative example 4 | PI-1 | PAG1 | Good | Bad |
| Comparative example 5 | PI-1 | PBG5 | Bad | Good |

According to Examples 1 to 4, it can be understood that upon exposing a resin composition comprising a polyimide resin and a compound that generates an imidazole compound by the action of light, the exposed portions became solubilized in alkali and accordingly a pattern can be formed satisfactorily.

Contrary to this, according to Comparative Examples 1 to 5, it can be understood that in the photosensitive resin composition containing a compound that generates a basic compound other than imidazole compounds by the action of light or a photo acid generator, in addition to the polyimide resin, a pattern cannot be formed satisfactorily or, even if a pattern can be formed, only a pattern which is poor in heat resistance can be formed.

The invention claimed is:

1. A positive photosensitive resin composition comprising an (A) polyimide resin and a (B) compound,
wherein the (B) compound generates an imidazole compound by the action of light,
and wherein the imidazole compound is represented by the following formula:

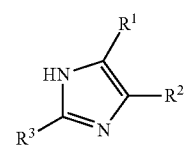

(1)

Wherein $R^1$, $R^2$ and $R^3$ each independently represent a hydrogen atom, a halogen atom, a hydroxyl group, a mercapto group, a sulfide group, a silyl group, a silanol group, a nitro group, a nitroso group, a phosphino group, a sulfonato group, a phosphino group, a phosphinyl group, a phosphonato group, or an organic group.

2. The composition according to claim 1, wherein the (B) compound is a compound represented by the following formula:

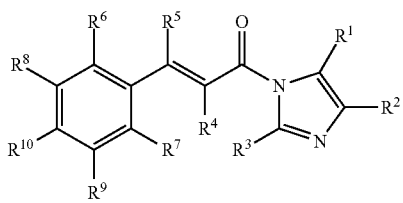

(2)

wherein, in the formula (2), $R^1$, $R^2$ and $R^3$ each independently represent a hydrogen atom, a halogen atom, a hydroxyl group, a mercapto group, a sulfide group, a silyl group, a silanol group, a nitro group, a nitroso group, a phosphino group, a sulfonato group, a phosphino group, a phosphinyl group, a phosphonato group, or an organic group;

$R^4$ and $R^5$ each independently represent a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, or an organic group;

$R^6$, $R^7$, $R^8$, $R^9$ and $R^{10}$ each independently represent a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group optionally including a heteroatom; and two or more of $R^6$, $R^7$, $R^8$, $R^9$ and $R^{10}$ optionally join together to form a cyclic structure.

3. A method for forming a polyimide resin pattern, the method comprising:
    forming a coating film of the composition according to claim 1;
    exposing the coating film to radiation or light to form a predetermined pattern; and
    removing exposed portions of the exposed coating film for development.

4. A patterned polyimide resin film comprising an (A) polyimide resin and a (B) compound,
    wherein the (B) compound generates an imidazole compound by the action of light,
    the imidazole compound is represented by the following formula:

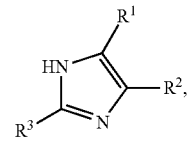

(1)

in the formula (1), $R^1$, $R^2$ and $R^3$ each independently represent a hydrogen atom, a halogen atom, a hydroxyl group, a mercapto group, a sulfide group, a silyl group, a silanol group, a nitro group, a nitroso group, a phosphino group, a sulfonato group, a phosphino group, a phosphinyl group, a phosphonato group, or an organic group.

5. The patterned polyimide resin film according to claim 4 formed by a method comprising:
    forming a coating film of a positive photosensitive resin composition;
    exposing the coating film to radiation or light, to thereby form a predetermined pattern; and
    removing exposed portions of the exposed coating film for development.

* * * * *